United States Patent
Ogawa et al.

(10) Patent No.: US 9,559,582 B2
(45) Date of Patent: Jan. 31, 2017

(54) SWITCHING POWER SUPPLY CIRCUIT

(71) Applicant: KABUSHIKI KAISHA TOSHIBA, Minato-ku (JP)

(72) Inventors: Taichi Ogawa, Inagi (JP); Takeshi Ueno, Kawasaki (JP); Tetsuro Itakura, Tokyo (JP); Takayuki Miyazaki, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/926,239

(22) Filed: Oct. 29, 2015

(65) Prior Publication Data
US 2016/0172967 A1 Jun. 16, 2016

(51) Int. Cl.
| | |
|---|---|
| *H02M 3/156* | (2006.01) |
| *H02M 3/04* | (2006.01) |
| *H03K 17/082* | (2006.01) |
| *H03K 17/30* | (2006.01) |
| *H02M 3/157* | (2006.01) |
| *H02M 1/00* | (2006.01) |

(52) U.S. Cl.
CPC .............. *H02M 3/04* (2013.01); *H02M 3/156* (2013.01); *H03K 17/082* (2013.01); *H03K 17/30* (2013.01); *H02M 2001/0032* (2013.01); *H02M 2001/0041* (2013.01); *H03K 2217/0036* (2013.01)

(58) Field of Classification Search
CPC .................. H02M 3/156; H02M 3/157; H02M 2001/0003; H02M 2001/0025; H02M 2001/0032; H02M 2001/0041; H02M 2001/0048; Y02B 70/10; Y02B 70/14
See application file for complete search history.

(56) References Cited

U.S. PATENT DOCUMENTS

| 5,617,016 | A | * | 4/1997 | Borghi | ............... G05F 1/575 323/282 |
|---|---|---|---|---|---|
| 5,883,501 | A | | 3/1999 | Arakawa | |
| 6,100,675 | A | | 8/2000 | Sudo | |
| 6,127,815 | A | | 10/2000 | Wilcox | |
| 6,366,066 | B1 | | 4/2002 | Wilcox | |

(Continued)

FOREIGN PATENT DOCUMENTS

| EP | 2 079 156 A2 | 7/2009 |
|---|---|---|
| JP | 9-288897 | 11/1997 |

OTHER PUBLICATIONS

Extended European Search Report issued May 9, 2016 in Patent Application No. 15192316.6.

*Primary Examiner* — Gary L Laxton
(74) *Attorney, Agent, or Firm* — Oblon, McClelland, Maier & Neustadt, L.L.P.

(57) ABSTRACT

According to an embodiment, a switching power supply circuit includes a comparison circuit and an operation control circuit. The comparison circuit operates intermittently in response to an operation control signal. The comparison circuit compares a feedback voltage based on the output voltage with a reference voltage to generate a comparison result signal representing a result of comparison. The operation control circuit generates the operation control signal based on the clock signal and the comparison result signal. The operation control circuit generates an operation control signal synchronous with the clock signal, if the comparison result signal is at the first level.

9 Claims, 9 Drawing Sheets

(56) References Cited

U.S. PATENT DOCUMENTS

| | | | |
|---|---|---|---|
| 7,119,525 B1 * | 10/2006 | Yoshino | H02M 3/157 323/283 |
| 8,164,391 B2 * | 4/2012 | Huynh | H02M 3/1563 307/82 |
| 2008/0054873 A1 | 3/2008 | Inoue | |
| 2009/0174340 A1 | 7/2009 | Kumagai | |
| 2013/0229160 A1 | 9/2013 | Saito et al. | |
| 2015/0077078 A1 * | 3/2015 | Hsu | H02M 3/156 323/282 |

* cited by examiner

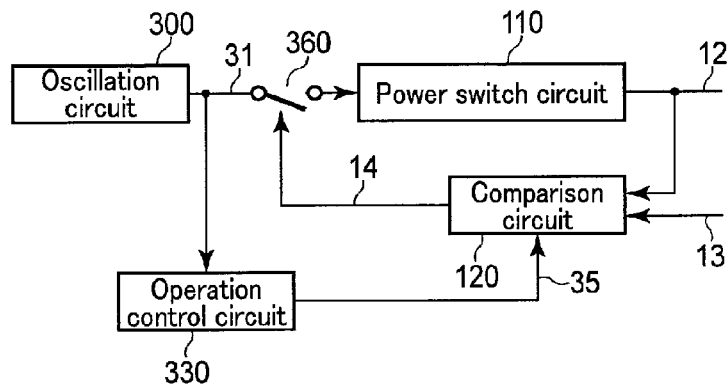
F I G. 6
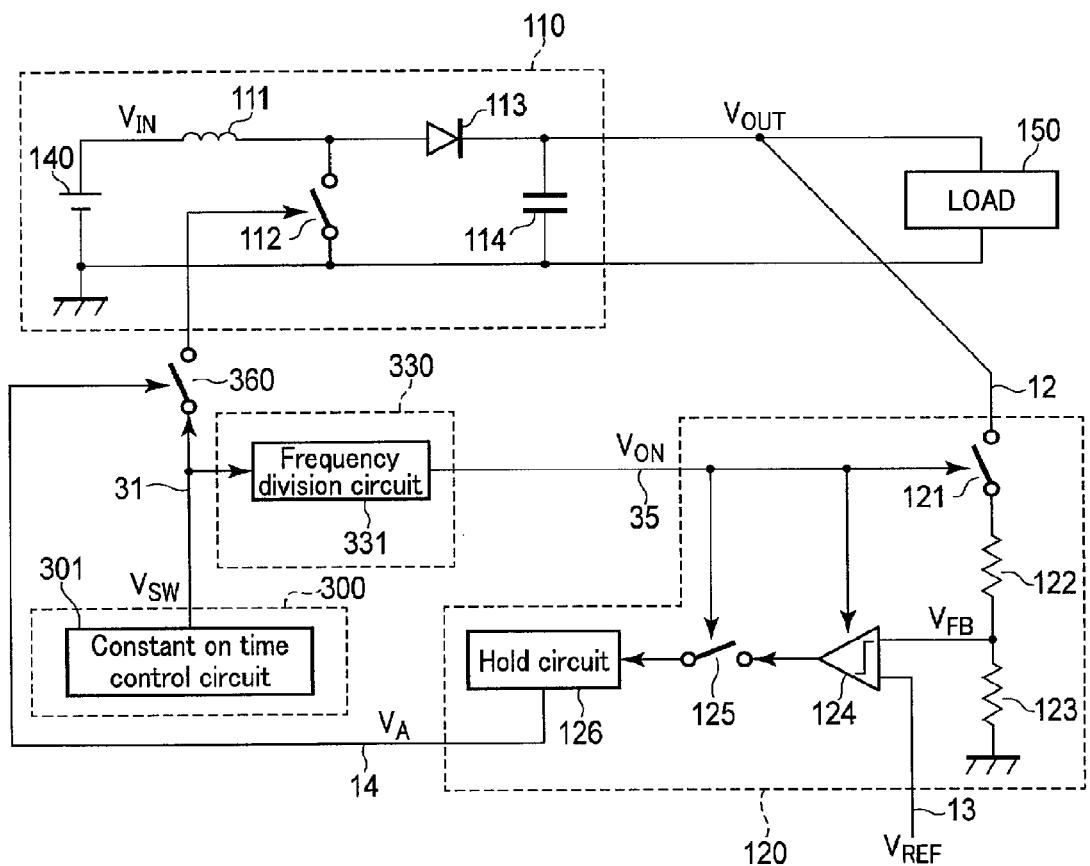
F I G. 7

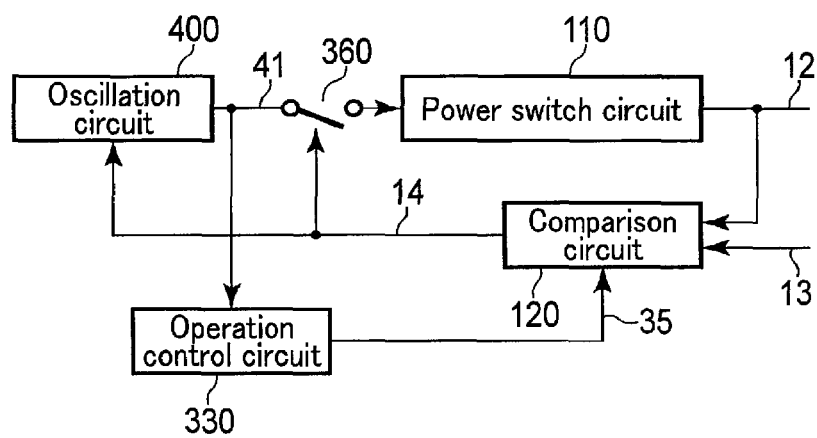
F I G. 9
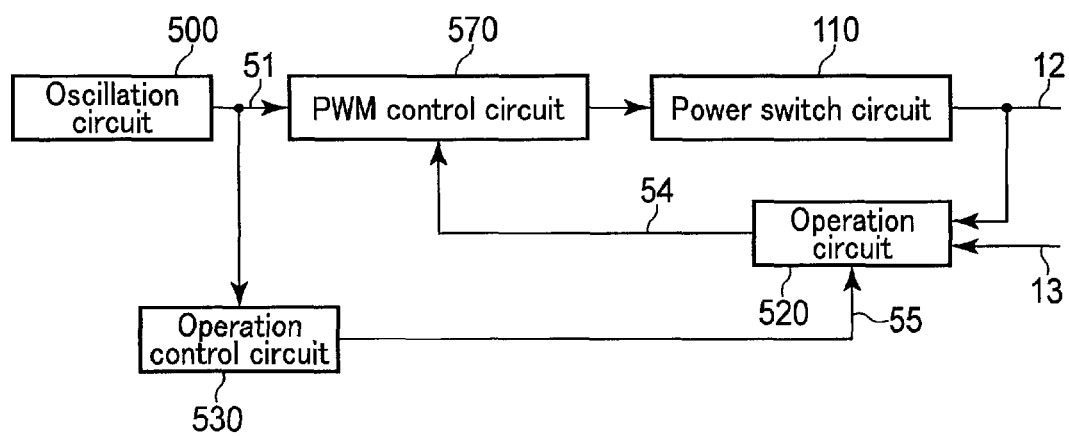
F I G. 10

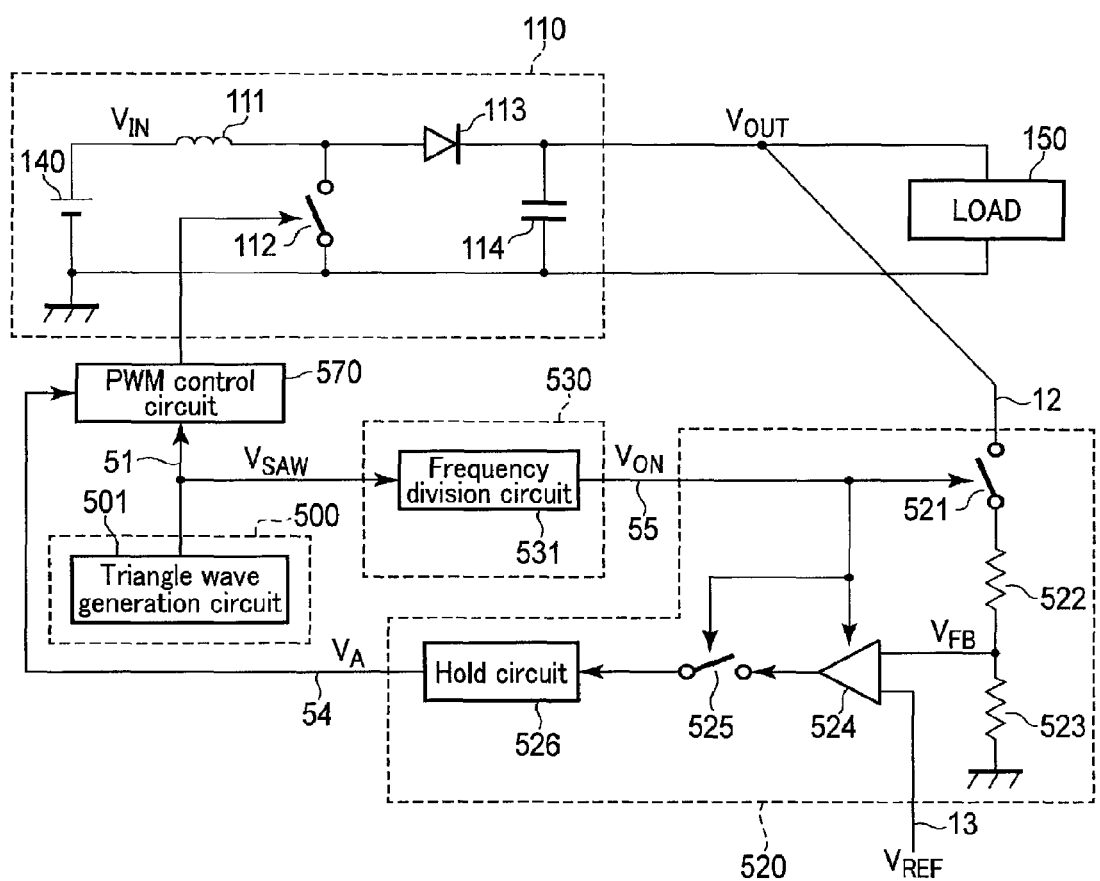
F I G. 11

SWITCHING POWER SUPPLY CIRCUIT

CROSS-REFERENCE TO RELATED APPLICATIONS

This application is based upon and claims the benefit of priority from Japanese Patent Application No. 2014-252032, filed Dec. 12, 2014, the entire contents of which are incorporated herein by reference.

FIELD

Embodiments described herein relate to a switching power supply circuit.

BACKGROUND

Typically, a switching power supply circuit includes a comparison circuit, an oscillation circuit and a booster circuit. The comparison circuit compares an output voltage of the booster circuit with a reference voltage and actuates the oscillation circuit when the output voltage becomes lower than the reference voltage. The oscillation circuit generates an oscillation signal and supplies this oscillation signal to the booster circuit. The booster circuit has its internal switch turned ON/OFF in accordance with the oscillation signal and generates an output voltage higher than the input voltage. When the output voltage of the booster circuit becomes higher than the reference voltage, the comparison circuit stops the oscillation circuit. By this negative feedback control, the output voltage of the booster circuit becomes closer to the reference voltage.

The power consumption by the comparison circuit can be reduced by operating the comparison circuit intermittently instead of operating it at all times. However, if a new signal source is added for generating an operation control signal that causes the comparison circuit to operate intermittently, the increase of power consumption caused by the addition of the new signal source becomes a problem.

BRIEF DESCRIPTION OF THE DRAWINGS

FIG. 6 is a block diagram illustrating a switching power supply circuit according to the third embodiment.

FIG. 7 is a block diagram illustrating the switching power supply circuit of the third embodiment.

FIG. 9 is a block diagram illustrating a switching power supply circuit according to the fourth embodiment.

FIG. 10 is a block diagram illustrating a switching power supply circuit according to the fifth embodiment.

FIG. 11 is a block diagram illustrating the switching power supply circuit of the fifth embodiment.

DETAILED DESCRIPTION

Figure 1:
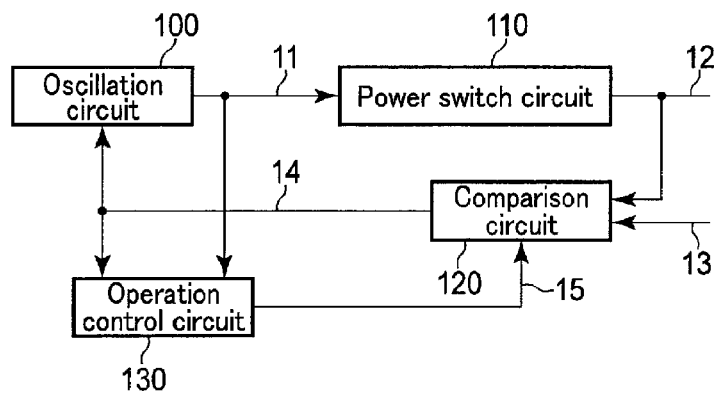
FIG. 1 is a block diagram illustrating a switching power supply circuit according to the first embodiment.

A description will now be given of the embodiments with reference to the accompanying drawings.

According to an embodiment, a switching power supply circuit includes a power switch circuit, a comparison circuit, an oscillation circuit and an operation control circuit. The power switch circuit generates an output voltage different in level from an input voltage, using a clock signal. The comparison circuit operates intermittently in response to an operation control signal. The comparison circuit compares a feedback voltage based on the output voltage with a reference voltage to generate a comparison result signal representing a result of comparison. The oscillation circuit oscillates at a predetermined frequency to generate the clock signal, if the comparison result signal is at a first level. The operation control circuit generates the operation control signal based on the clock signal and the comparison result signal. The operation control circuit generates an operation control signal synchronous with the clock signal, if the comparison result signal is at the first level.

According to another embodiment, a switching power supply circuit includes an oscillation circuit, an operation control circuit, a power switch circuit, a comparison circuit and a switch. The oscillation circuit oscillates at a predetermined frequency to generate a clock signal. The operation control circuit generates an operation control signal synchronous with the clock signal. The power switch circuit generates an output voltage different in level from an input voltage, using the clock signal. The comparison circuit operates intermittently in response to the operation control signal. The comparison circuit compares a feedback voltage based on the output voltage with a reference voltage to generate a comparison result signal representing a result of comparison. The switch permits the clock signal from the oscillation circuit to be supplied to the power switch circuit if the comparison result signal is at a first level, and stops supply of the clock signal from the oscillation circuit if the comparison result signal is at a second level.

According to another embodiment, a switching power supply circuit includes a power switch circuit, an oscillation circuit, an operation control circuit, an operation circuit and a pulse width modulation (PWM) control circuit. The power switch circuit generates an output voltage different in level from an input voltage, using a switching control signal. The oscillation circuit oscillates at a predetermined frequency to generate a triangle wave signal. The operation control circuit generates an operation control signal synchronous with the triangle wave signal. The operation circuit operates intermittently in response to the operation control signal. The operation circuit performs an operation using (i) a feedback voltage based on the output voltage and (ii) a reference voltage to generate an operation result signal representing a result of operation. The PWM control circuit uses the operation result signal as an analog control voltage and performs pulse width modulation for the triangle wave signal to generate the switching control signal.

In the descriptions below, the same reference numerals or symbols will be used to refer to explained elements or similar elements, and redundant descriptions will be avoided.

First Embodiment

As illustrated in FIG. 1, a switching power supply circuit according to the first embodiment comprises an oscillation circuit 100, a power switch circuit 110, a comparison circuit 120 and an operation control circuit 130.

The oscillation circuit 100 includes a control terminal and an output terminal. The control terminal of the oscillation circuit 100 is connected to the output terminal of the comparison circuit 120. The output terminal of the oscillation circuit 100 is connected to both the control terminal of the power switch circuit 110 and the first input terminal of the operation control circuit 130.

The oscillation circuit 100 receives a comparison result signal 14, described later, from the comparison circuit 120. If the comparison result signal 14 is at a first level (e.g., a high level), the oscillation circuit 100 oscillates at a predetermined frequency, thereby generating a clock signal 11. The clock signal 11 is supplied to the power switch circuit 110 and the operation control circuit 130. On the other hand, if the comparison result signal is at a second level (e.g., a low level), the oscillation circuit 100 stops its operation (the generation of clock signals 11).

The power switch circuit 110 corresponds to a booster circuit or a voltage lowering circuit. The power switch circuit 110 includes at least a control terminal and an output terminal. The control terminal of the power switch circuit 110 is connected to the output terminal of the oscillation circuit 100. The output terminal of the power switch circuit 110 is connected to the first input terminal of the comparison circuit 120.

The power switch circuit 110 receives a clock signal 11 from the oscillation circuit 100. The power switch circuit 110 has its internal switch turned ON/OFF in accordance with the clock signal 11, so that an input voltage applied from an input voltage source (not shown) is increased or decreased, and generates an output voltage having a different level from that of the input voltage. The power switch circuit 110 supplies the output voltage 12 to the first input terminal of the comparison circuit 120. The power switch circuit 110 may incorporate the input voltage source; alternatively, it may have its input terminal connected to an external input voltage source.

The comparison circuit 120 includes a first input terminal, a second input terminal, a control terminal and an output terminal. The first input terminal of the comparison circuit 120 is connected to the output terminal of the power switch circuit 110 and is applied with the output voltage 12. The second input terminal of the comparison circuit 120 is applied with a reference voltage 13. The control terminal of the comparison circuit 120 is connected to the output terminal of the operation control circuit 130. The output terminal of the comparison circuit 120 is connected to both the control terminal of the oscillation circuit 100 and the second input terminal of the operation control circuit 130.

The comparison circuit 120 receives an operation control signal 15 from the operation control circuit 130. The comparison circuit 120 operates intermittently in accordance with the operation control signal 15. If the operation control signal 15 at a first level, the comparison circuit 120 compares a feedback voltage based on the output voltage 12 with the reference voltage 13. The feedback voltage may be either a voltage obtained by dividing the output voltage 12 or the output voltage 12 itself. The comparison circuit 120 performs negative feedback control for the power switch circuit 110 by way of the oscillation circuit 100, in such a manner that the feedback voltage becomes equal to the reference voltage 13. For example, if the feedback voltage is a/b times as high as the output voltage 12 (a and b are arbitrary natural numbers), the negative feedback control is performed so that the output voltage 12 is equal to b/a of the reference voltage 13.

In case that the feedback voltage is not lower than the reference voltage 13, the comparison circuit 120 generates a comparison result signal 14 of a second level. In the other case, the comparison circuit 120 generates a comparison result signal 14 of a first level. The comparison circuit 120 supplies the comparison result signal 14 to the oscillation circuit 100 and the operation control circuit 130. If the operation control signal 15 is at the second level, the comparison circuit 120 stops comparison between the feedback voltage and the reference voltage 13, and continues to output the comparison result signal generated last (i.e., the comparison result signal generated immediately before the operation control signal 15 transitions from the first level to the second level).

The comparison circuit 130 includes a first input terminal, a second input terminal, and an output terminal. The first input terminal of the operation control circuit 130 is connected to the output terminal of the oscillation circuit 100. The second input terminal of the operation control circuit 130 is connected to the output terminal of the comparison circuit 120. The output terminal of the operation control circuit 130 is connected to the control terminal of the comparison circuit 120.

The operation control circuit 130 receives a clock signal 11 from the oscillation circuit 100 and a comparison result signal 14 from the comparison circuit 120. If the comparison result signal 14 is at the first level, the operation control circuit 130 generates an operation control signal 15 synchronous with the clock signal 11, and supplies that operation control signal 15 to the comparison circuit 120. As described above, the comparison circuit 120 intermittently compares the feedback voltage with the reference voltage 13 in accordance with the operation control signal. The operation control circuit 130 may generate the operation control signal 15, for example, by dividing the frequency of the clock signal 11.

If the comparison result signal 14 is at the second level, the clock signal 11 is not generated. Thus, the operation control circuit 130 generates an operation control signal 15 asynchronous with the clock signal 11, and supplies that operation control signal 15 to the comparison circuit 120. As long as the comparison result signal 14 is at the second level, the operation control signal 15 is set at the first level. Therefore, the comparison circuit 120 can continue to compare the feedback voltage with the reference voltage 13 even during the periods when the clock signal 11 is not generated.

Figure 2:
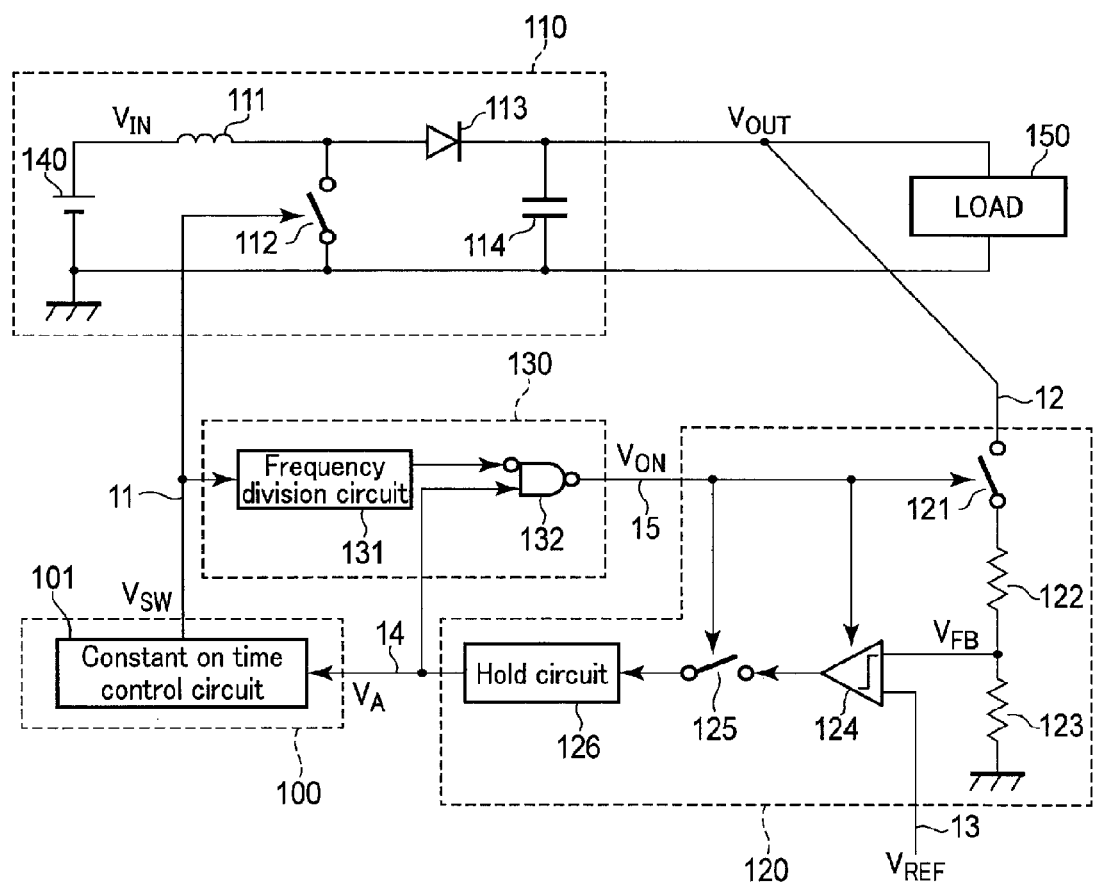
FIG. 2 is a block diagram illustrating the switching power supply circuit of the first embodiment.

FIG. 2 shows a specific example of the configuration of the switching power supply circuit of the first embodiment. The switching power supply circuit depicted in FIG. 2 comprises an oscillation circuit 100, a power switch circuit 110, a comparison circuit 120 and an operation control circuit 130. The switching power supply circuit depicted in FIG. 2 is connected to a load 150, which will be described later.

The oscillation circuit 100 depicted in FIG. 2 includes a constant on time control circuit 101.

The constant on time control circuit 101 includes a control terminal and an output terminal. The control terminal and output terminal of the constant on time control circuit 101 are connected to the control terminal and output terminal of the oscillation circuit 100, respectively.

Figure 3:
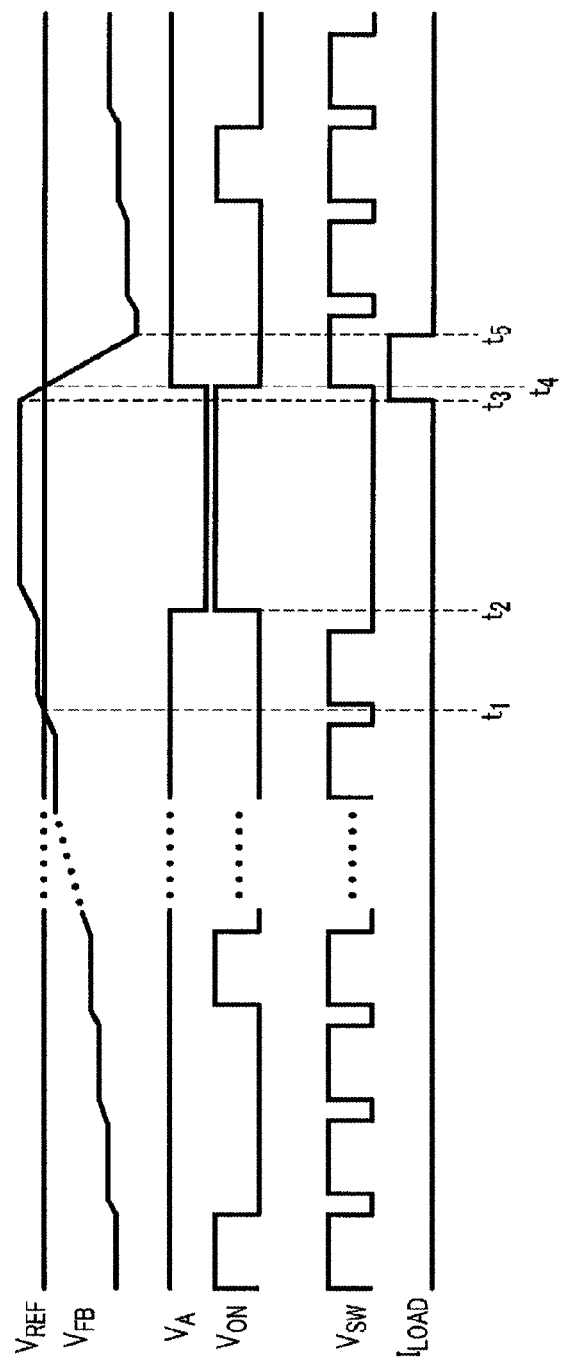
FIG. 3 is a timing chart illustrating the operation of the switching power supply circuit depicted in FIG. 2.

The constant on time control circuit 101 receives a comparison result signal 14 ($V_A$) from the control terminal. If the comparison result signal 14 ($V_A$) is at the first level, the constant on time control circuit 101 generates a clock signal 11 ($V_{SW}$) by oscillating at a predetermined frequency, and outputs the clock signal 11 ($V_{SW}$) from the output terminal. As shown in FIG. 3, the clock signal 11 ($V_{SW}$) corresponds to a pulse signal having predetermined ON periods and OFF periods. To be specific, upon receipt of the comparison result signal 14 ($V_A$) at the first level, the constant on time control circuit 101 generates an ON pulse lasting for a predetermined time as a clock signal 11 ($V_{SW}$). In addition, if the comparison result signal 14 ($V_A$) is at the first level even after the output of the ON pulse, the constant on time control circuit 101 generates an ON pulse again as a clock signal 11 ($V_{SW}$). On the other hand, if the comparison result signal 14 ($V_A$) is at the second level, the constant on time control circuit 101 stops its operation (the generation of clock signals 11 ($V_{SW}$)).

The power switch circuit 110 depicted in FIG. 2 corresponds to a booster circuit and includes an inductor 111, a switch 112, a diode 113, a capacitor 114 and an input voltage source 140. For the sake of simplicity, the power switch circuit 110 will be supposed to be a booster circuit in the description below.

The inductor 111 includes a first terminal and a second terminal. The first terminal of the inductor 111 is connected to the positive electrode terminal of the input voltage source 140. The second terminal of the inductor 111 is connected to both the first terminal of the switch 112 and the anode of the diode 113.

The inductor 111 stores magnetic energy by a current flowing through the inductor 111 while the switch 112 is ON. The inductor 111 discharges the stored magnetic energy as electric energy while the switch 112 is OFF.

The switch 112 includes a first terminal, a second terminal and a control terminal. The first terminal of the switch 112 is connected to both the second terminal of the inductor 111 and the anode of the diode 113. The second terminal of the switch 112 is grounded. The control terminal of the switch 112 is connected to the control terminal of the power switch circuit 110.

The switch 112 receives a clock signal 11 ($V_{SW}$) at the control terminal and performs ON/OFF operation in response to the clock signal 11 ($V_{SW}$). To be specific, the switch 112 short-circuits the second terminal of the inductor 111 and the anode of the diode 113 to each other or disconnects them from each other.

The diode 113 includes an anode and a cathode. The anode of the diode 113 is connected to both the second terminal of the inductor 111 and the first terminal of the switch 112. The cathode of the diode 113 is connected to the first terminal of the capacitor 114.

The diode 113 allows a current supplied from the inductor 111 to flow to the capacitor 114 after the switch 112 is switched from ON to OFF. The diode 113 also prevents a current from flowing back to the input voltage source 140 from the capacitor 114.

The capacitor 114 includes a first terminal and a second terminal. The first terminal of the capacitor 114 is connected to the output terminal of the power switch circuit 110, which in turn is connected to the cathode of the diode 113, the input terminal of the comparison circuit 120 and the load 150. The second terminal of the capacitor 114 is grounded. The capacitor 114 is charged by a current supplied from the diode 113 after the switch 112 is switched from ON to OFF. Accordingly, the voltage ($V_{OUT}$) at the first terminal of the capacitor 114 increases. On the other hand, if the current supply from the diode 113 is stopped, the capacitor 114 discharges owing to the load current flowing through the load 150. Accordingly, the voltage ($V_{OUT}$) at the first terminal of the capacitor 114 decreases.

The input voltage source 140 includes a positive terminal and a negative terminal. The positive terminal of the input voltage source 140 is connected to the first terminal of the inductor 111. The negative terminal of the input voltage source 140 is grounded. The input voltage source 140 generates an input voltage ($V_{IN}$) and applies the input voltage ($V_{IN}$) to the first terminal of the inductor 111. The input voltage source 140 is, for example, a battery. It may be incorporated in the power switch circuit 110 or may be provided external to the power switch circuit 110.

The comparison circuit 120 depicted in FIG. 2 may include a switch 121, resisters 122 and 123, a comparator, a switch 125 and a hold circuit 126.

The switch 121 includes a first terminal, a second terminal and a control terminal. The first terminal of the switch 121 is connected to the first input terminal of the comparison circuit 120. The second terminal of the switch 121 is connected to the first terminal of resistor 122. The control terminal of the switch 121 is connected to the control terminal of the comparison circuit 120.

The switch 121 receives an operation control signal 15 ($V_{ON}$) at the control terminal and performs ON/OFF operation in response to the operation control signal 15 ($V_{ON}$). In other words, the switch 121 short-circuits the first input terminal of the comparison circuit 120 and the first terminal of resistor 122 to each other or disconnects them from each other in accordance with the operation control signal 15 ($V_{ON}$)

To be specific, if the operation control signal 15 ($V_{ON}$) is at the first level, the switch 121 allows the output voltage 12 ($V_{OUT}$) to be applied to resistor 122. On the other hand, if the operation control signal 15 ($V_{ON}$) is at the second level, the switch 121 does not allow application of the output voltage 12 ($V_{OUT}$).

As can be seen, resistor 122 and resistor 123 function as a voltage divider. Resistor 122 includes a first terminal and a second terminal. The first terminal of resistor 122 is connected to the second terminal of switch 121. The second terminal of resistor 122 is connected to both the first terminal of resistor 123 and the first input terminal of the comparator 124. Resistor 123 includes a first terminal and a second terminal. The first terminal of resistor 123 is connected to both the second terminal of resistor 122 and the first input terminal of the comparator 124. The second terminal of resistor 123 is grounded.

When the switch 121 in ON, the first terminal of resistor 122 is applied with an output voltage 12 ($V_{OUT}$) through the switch 121. The output voltage 12 ($V_{OUT}$) is divided in accordance with the resistance ratio of resistors 122 and 123. Eventually, the voltage appearing at the second terminal of resistor 122 and at the first terminal of resistor 123 is applied to the first input terminal of the comparator 124 as a feedback voltage ($V_{FB}$). For example, if the resistance of resistor 122 is $R_1$ and the resistance of resistor 123 is $R_2$, the following formula is satisfied:

$$V_{FB}=R_2 * V_{OUT}/(R_1+R_2).$$

The comparator 124 includes a first input terminal, a second input terminal, a control terminal and an output terminal. The first terminal of the comparator 124 is connected to both the second terminal of resistor 122 and the first terminal of resistor 123. The second input terminal of the comparator 124 is applied with a reference voltage 13 ($V_{REF}$). The output terminal of the comparator 124 is connected to the first terminal of switch 125. The control terminal of the comparator 124 is connected to the control terminal of the comparison circuit 120.

The comparator 124 compares the feedback voltage ($V_{FB}$) applied to the first input terminal with the reference voltage 13 ($V_{REF}$) applied to the second input terminal. If the feedback voltage ($V_{FB}$) is not lower than the reference voltage 13 ($V_{REF}$), the comparator 124 outputs a comparison result signal 14 of the second level from the output terminal. If the feedback voltage ($V_{FB}$) is lower than the reference voltage 13 ($V_{REF}$), the comparator 124 outputs a comparison result signal 14 of the first level from the output terminal.

The comparator 124 receives an operation control signal 15 ($V_{ON}$) from the control terminal. If the operation control signal 15 ($V_{ON}$) is at the first level, the comparator 124 performs the operation described above (namely, the comparison of the feedback voltage ($V_{FB}$) with the reference voltage 13 ($V_{REF}$)). On the other hand, if the operation control signal 15 ($V_{ON}$) is at the second level, the comparator 124 stops the above operation. That is, the comparator 124 operates intermittently in accordance with the operation control signal 15 ($V_{ON}$).

The switch 125 includes a first terminal, a second terminal and a control terminal. The first terminal of the switch 125 is connected to the output terminal of the comparator 124. The second terminal of the switch 125 is connected to the input terminal of the hold circuit 126. The control terminal of the switch 125 is connected to the control terminal of the comparison circuit 120.

The switch 125 receives an operation control signal 15 ($V_{ON}$) at the control terminal and performs ON/OFF operation in response to the operation control signal 15 ($V_{ON}$). In other words, the switch 125 short-circuits the output terminal of the comparator 124 and the input terminal of the hold circuit 126 to each other or disconnects them from each other in accordance with the operation control signal 15 ($V_{ON}$).

To be specific, if the operation control signal 15 ($V_{ON}$) is at the first level, the switch 125 allows the comparison result signal 14 ($V_A$) to be supplied to the hold circuit 126. On the other hand, if the operation control signal 15 ($V_{ON}$) is at the second level, the switch 125 does not allow the comparison result signal 14 ($V_A$) from the comparator 124 to be supplied.

The hold circuit 126 holds an input signal and outputs the held signal. The hold circuit 126 includes an input terminal and an output terminal. The input terminal of the hold circuit 126 is connected to the second terminal of the switch 125. The output terminal of the hold circuit 126 is connected to the output terminal of the comparison circuit 120. The hold circuit 126 is, for example, a latch circuit.

The hold circuit 126 receives a comparison result signal 14 ($V_A$) from the input terminal during an ON period of the switch 125, and holds it. The hold circuit 126 outputs the held comparison result signal 14 ($V_A$) from the output terminal. The comparator 124 does not generate a comparison result signal 14 ($V_A$) during an OFF period of the switch 125, but the hold circuit 126 holds the comparison result signal 14 ($V_A$) supplied thereto immediately before the switch 125 is turned OFF (namely, immediately before the operation control signal 15 ($V_A$) transitions from the first level to the second level). For this reason, the hold circuit 126 can output the comparison result signal 14 ($V_A$) even during the OFF period of the switch 125.

The operation control circuit 130 depicted in FIG. 2 comprises a frequency division circuit 131 and a logic circuit 132.

The frequency division circuit 131 includes an input terminal and an output terminal. The input terminal of the frequency division circuit 131 is connected to the first input terminal of the operation control circuit 130. The output terminal of the frequency division circuit 131 is connected to the first input terminal of the logic circuit 132.

The frequency division circuit 131 receives a clock signal 11 ($V_{SW}$) from the input terminal. The frequency division circuit 131 divides the frequency of a clock signal 11 ($V_{SW}$), thereby generating a frequency division signal. The frequency division circuit 131 outputs the frequency division signal from the output terminal. The greater the frequency-dividing ratio used by the frequency division circuit 131 is, the less frequently the comparison circuit 120 operates. The frequency-dividing ratio may be "1", in which case the frequency division circuit 131 need not be employed.

The logic circuit 132 includes a first input terminal, a second input terminal, and an output terminal. The first input terminal of the logic circuit 132 is connected to the output terminal of the frequency division circuit 131. The second input terminal of the logic circuit 132 is connected to the output terminal of the comparison circuit 120. The output terminal of the logic circuit 132 is connected to the output terminal of the operation control circuit 130.

The logic circuit 132 receives a frequency division signal from the first input terminal and receives a comparison result signal 14 ($V_A$) from the second input terminal. The logic circuit 132 calculates a logically inverted value of a logical conjunction between the logically inverted value of the frequency division signal and the comparison result signal 14 ($V_A$), thereby generating an operation control signal 15 ($V_{ON}$). The logic circuit 132 outputs the operation control signal 15 ($V_{ON}$) from the output terminal.

If the comparison result signal 14 ($V_A$) is at the first level, then the operation control signal 15 ($V_{ON}$) corresponds to the frequency division signal. If the comparison result signal 14 ($V_A$) is at the second level, then the operation control signal 15 ($V_{ON}$) corresponds to a signal having the first level, irrespective of the frequency division signal.

The load 150 depicted in FIG. 2 may be of any type. The load 150 is connected to the output terminal of the power switch circuit 110. The load 150 may be a secondary battery or an electronic device.

The switching power supply circuit depicted in FIG. 2 operates in such a manner as is illustrated in FIG. 3. In FIG. 3, $I_{LOAD}$ denotes a load current flowing through the load 150. In the example shown in FIG. 3, the feedback voltage ($V_{FB}$) is lower than the reference voltage 13 ($V_{REF}$) until time $t_1$. Therefore, the comparison circuit 120 keeps generating comparison result signals ($V_A$) of high level when it is in the operating condition. In other words, the comparison result signals ($V_A$) of high level are kept output, irrespective of the operating condition and the non-operating condition of the comparison circuit 120.

The oscillation circuit 100 keeps generating clock signals 11 ($V_{SW}$) in response to the comparison result signals 14 ($V_A$) of high level. The power switch circuit 110 increases the output voltage 12 ($V_{OUT}$), using the clock signal 11 ($V_{SW}$). The comparison circuit 120 operates intermittently in response to the frequency division signal (frequency-dividing ratio: 3) of the clock signal 11 ($V_{SW}$), which is generated as the operation control signal 15 ($V_{ON}$).

At time $t_1$, the feedback voltage ($V_{FB}$) becomes equal to the reference voltage 13 ($V_{REF}$). However, since the operation control signal 15 ($V_{ON}$) is at the low level at time $t_1$, the comparison circuit 120 does not perform the comparison operation, and the comparison signal 14 ($V_A$) of high level generated last continues to be output.

At time $t_2$, the operation control signal 15 ($V_{ON}$) becomes high in level, and the comparison circuit 120 resumes the comparison operation. The comparison circuit 120 detects that the feedback voltage ($V_{FB}$) is not lower than the reference voltage 13 ($V_{REF}$), and generates and outputs a comparison result signal 14 ($V_A$) of low level.

In response to the comparison result signal 14 ($V_A$) of low level, the operation control circuit 130 outputs an operation control signal 15 ($V_{ON}$) of high level. The oscillation circuit 100 stops its operation in response to the comparison result signal 14 ($V_A$) of low level. That is, as long as the comparison result signal 14 ($V_A$) is low in level, the comparison circuit 120 continues to perform the comparison operation and the oscillation circuit 100 is kept in the non-operating condition.

From time $t_3$ to time $t_5$, the load current ($I_{LOAD}$) flows through the load 150. As a result, the output voltage 12 ($V_{OUT}$) lowers, and in accordance therewith the feedback voltage ($V_{FB}$) also lowers.

At time $t_4$, the feedback voltage ($V_{FB}$) becomes equal to the reference voltage 13 ($V_{REF}$). Since the operation control signal 15 ($V_{ON}$) is high in level at time $t_4$, the comparison circuit 120 is performing the comparison operation. Therefore, the comparison circuit 120 detects that the feedback voltage ($V_{FB}$) is lower than the reference voltage 13 ($V_{REF}$) and generates and outputs a comparison result signal 14 ($V_A$) of high level.

The oscillation circuit 100 resumes its operation in response to the comparison result signal 14 ($V_A$) of high level, and the power switch circuit 110 also resumes its operation. As a result, the feedback voltage ($V_{FB}$) starts increasing. On the other hand, the comparison circuit 120 operates intermittently in response to the frequency division signal (frequency-dividing ratio: 3) of the clock signal 11 ($V_{SW}$), which is generated as the operation control signal 15 ($V_{ON}$).

As described above, the switching power supply circuit of the first embodiment generates an operation control signal synchronous with the clock signal used for driving the power switch circuit when this power switch circuit is operating, and thereby permits the comparison circuit to operate intermittently. On the other hand, the switching power supply circuit generates an operation control signal asynchronous with the clock signal when the power switch circuit is not operating, and thereby permits the comparison circuit to operate at all times. In this manner, the switching power supply circuit causes the comparison circuit to operate intermittently when the power switch circuit is operating, and the power consumption can be reduced, accordingly. T when the power switch circuit is operating, the driving signal source of the power switch circuit is used for that intermittent operation. Accordingly, a new signal source need not be added.

Second Embodiment

Figure 4:
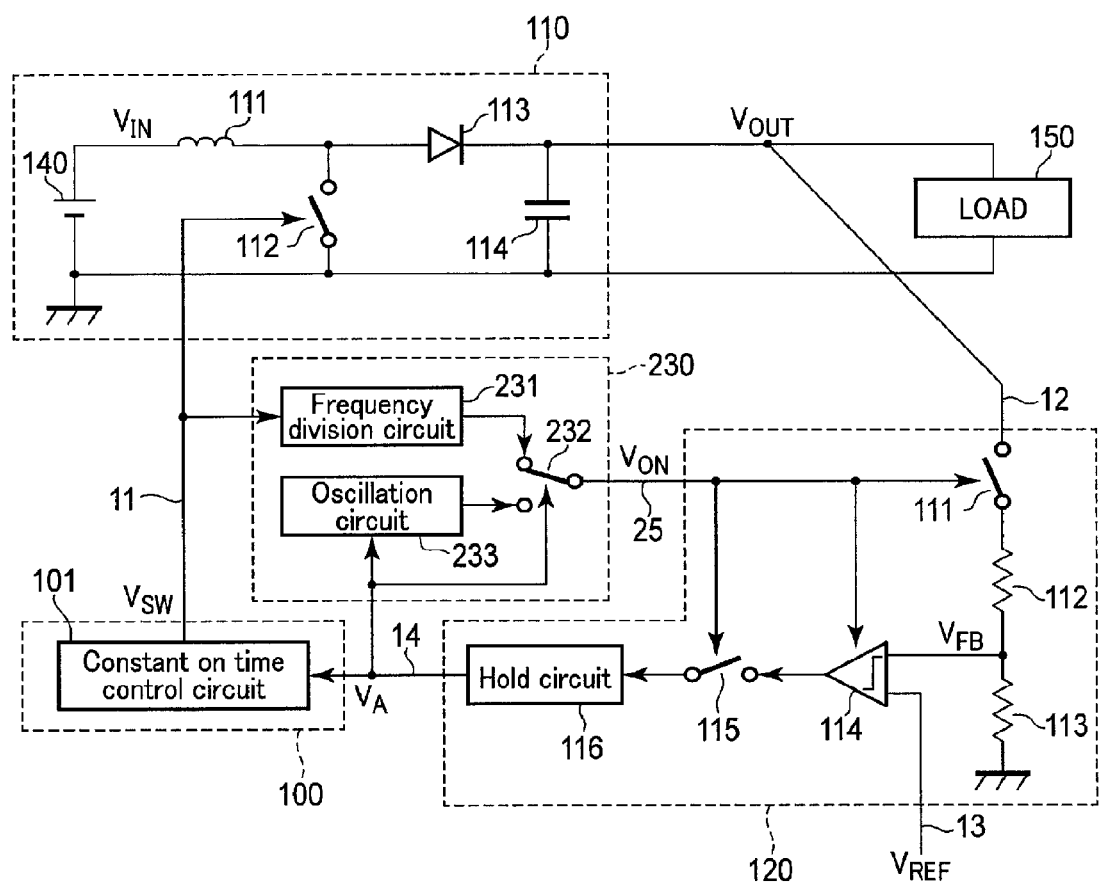
FIG. 4 is a block diagram illustrating a switching power supply circuit according to the second embodiment.

As illustrated in FIG. 4, a switching power supply circuit according to the second embodiment comprises an oscillation circuit 100, a power switch circuit 110, a comparison circuit 120 and an operation control circuit 230. The switching power supply circuit depicted in FIG. 4 is connected to a load 150.

The oscillation circuit 100 depicted in FIG. 4 differs from the oscillation circuit 100 depicted in FIG. 2 in that a clock signal 11 is supplied to the operation control circuit 230. The power switch circuit 110 and load 150 depicted in FIG. 4 may be the same as or similar to the power switch circuit 110 and load 150 depicted in FIG. 2. The comparison circuit 120 depicted in FIG. 4 differs from the comparison circuit 120 depicted in FIG. 2 in that it receives an operation control signal 25 from the operation control circuit 230.

The operation control circuit 230 includes a first input terminal, a second input terminal, and an output terminal. The first input terminal of the operation control circuit 230 is connected to the output terminal of the oscillation circuit 100. The second input terminal of the operation control circuit 230 is connected to the output terminal of the comparison circuit 120. The output terminal of the operation control circuit 230 is connected to the control terminal of the comparison circuit 120.

The operation control circuit 230 receives a clock signal 11 ($V_{SW}$) from the oscillation circuit 100 and a comparison result signal 14 ($V_A$) from the comparison circuit 120. If the comparison result signal 14 ($V_A$) is at the first level, the operation control circuit 230 generates an operation control signal 25 ($V_{ON}$) synchronous with the clock signal 11, and supplies that operation control signal 25 ($V_{ON}$) to the comparison circuit 120. The comparison circuit 120 intermittently compares the feedback voltage ($V_{FB}$) with the reference voltage 13 ($V_{REF}$) in accordance with the operation control signal 25 ($V_{ON}$). The operation control circuit 230 may generate the operation control signal 25 ($V_{ON}$), for example, by dividing the frequency of the clock signal 11.

If the comparison result signal 14 ($V_A$) is at the second level, the clock signal 11 ($V_{SW}$) is not generated. Thus, the operation control circuit 230 causes a signal source incorporated therein to generate an operation control signal 25 ($V_{ON}$) asynchronous with the clock signal 11 ($V_S$), and supplies that operation control signal 25 ($V_{ON}$) to the comparison circuit 120. The operation control signal 25 ($V_{ON}$) periodically transitions between the first level and the second level as long as the comparison result signal 14 ($V_A$) is at the second level. Accordingly, the comparison circuit 120 can intermittently compare the feedback voltage with the reference voltage 13 even when the clock signal 11 ($V_{SW}$) is not generated.

The operation control circuit 230 comprises a frequency division circuit 231, a selector 232 and an oscillation circuit 233.

The frequency division circuit 231 includes an input terminal and an output terminal. The input terminal of the frequency division circuit 231 is connected to the first input terminal of the operation control circuit 230. The output terminal of the frequency division circuit 231 is connected to the first input terminal of the selector 232.

The frequency division circuit 231 receives a clock signal 11 ($V_{SW}$) from the input terminal. The frequency division circuit 231 divides the frequency of a clock signal 11 ($V_{SW}$), thereby generating a frequency division signal. The frequency division circuit 231 outputs the frequency division signal from the output terminal. The greater the frequency-dividing ratio used by the frequency division circuit 231 is, the less frequently the comparison circuit 120 operates during a period when the comparison result signal 14 ($V_A$) at the first level. The frequency-dividing ratio may be "1", in which case the frequency division circuit 231 need not be employed.

The selector 232 includes a first input terminal, a second input terminal, an output terminal and a control terminal. The first input terminal of the selector 232 is connected to the output terminal of the frequency division circuit 231. The second input terminal of the selector 232 is connected to the output terminal of the frequency division circuit 233. The output terminal of the selector 232 is connected to the output terminal of the operation control circuit 230. The control terminal of the selector 232 is connected to the second input terminal of the operation control circuit 230.

The selector 232 receives a frequency division signal from the first input terminal, receives an oscillation signal (to be described later) from the second input terminal, and receives a comparison result signal 14 ($V_A$) from the control terminal. The selector 232 selects either the frequency division signal or the oscillation signal in accordance with the comparison result signal 14 ($V_A$), and supplies the selected signal to the output terminal as an operation control signal 25 ($V_{ON}$).

To be specific, if the comparison result signal 14 ($V_A$) is at the first level, the selector 232 selects the frequency division signal. On the other hand, if the comparison result signal 14 ($V_A$) is at the second level, the selector 232 selects the oscillation signal. If the comparison result signal 14 ($V_A$) is at the first level, then the operation control signal 25 ($V_{ON}$) corresponds to the frequency division signal. If the comparison result signal 14 ($V_A$) is at the second level, then the operation control signal 25 ($V_{ON}$) corresponds to the oscillation signal.

The oscillation circuit 233 includes a control terminal and an output terminal. The control terminal of the oscillation circuit 233 is connected to the second input terminal of the operation control circuit 230. The output terminal of the oscillation circuit 233 is connected to the second input terminal of the selector 232.

The oscillation circuit 233 receives a comparison result signal 14 ($V_A$) from the control terminal. If the comparison result signal 14 ($V_A$) is at the second level, the oscillation circuit 233 generates an oscillation signal by oscillating at a predetermined frequency, and supplies the oscillation signal to the selector 232. The oscillation signal corresponds to a pulse signal having predetermined ON periods and OFF periods. On the other hand, if the comparison result signal 14 ($V_A$) is at the first level, the oscillation circuit 233 stops its operation (the generation of an oscillation signal). The oscillation circuit 233 may be, for example, a constant on time control circuit. The oscillation circuit 233 can be referred to as an internal oscillation circuit to distinguish it from oscillation circuit 100.

Figure 5:
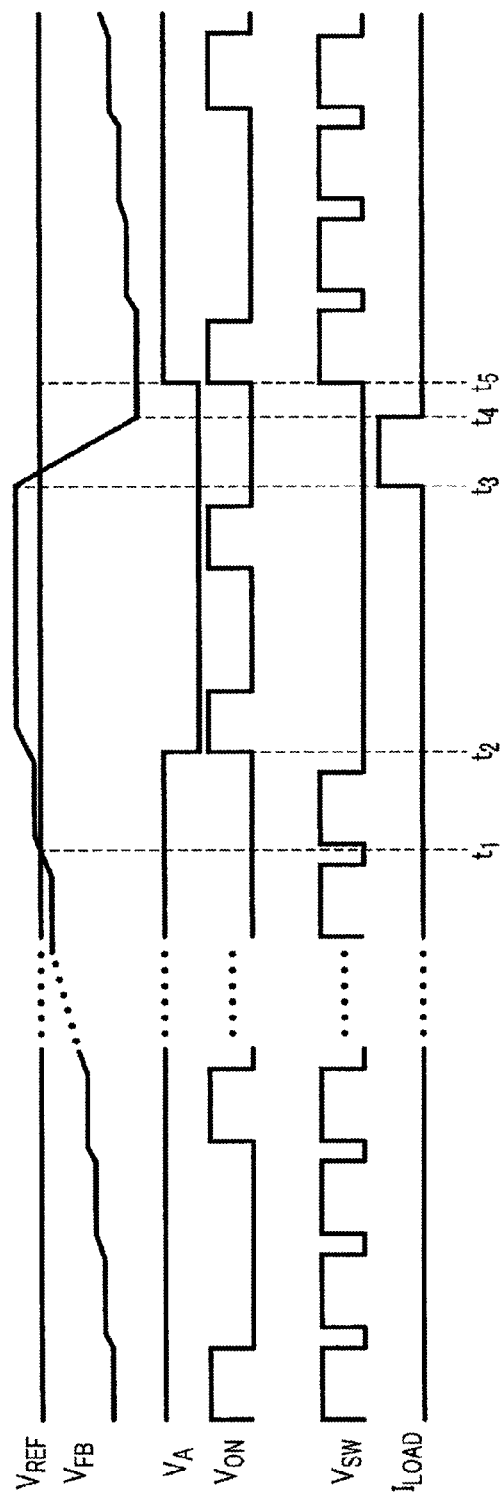
FIG. 5 is a timing chart illustrating the operation of the switching power supply circuit depicted in FIG. 4.

The switching power supply circuit depicted in FIG. 4 operates in such a manner as is illustrated in FIG. 5. In FIG. 5, $I_{LOAD}$ denotes a load current flowing through the load 150. In the example shown in FIG. 5, the feedback voltage ($V_{FB}$) is lower than the reference voltage 13 ($V_{REF}$) until time $t_1$. Therefore, the comparison circuit 120 keeps generating comparison result signals ($V_A$) of high level when it is in the operating condition. In other words, the comparison result signals ($V_A$) of high level are kept output, irrespective of the operating condition and the non-operating condition of the comparison circuit 120.

The oscillation circuit 100 keeps generating clock signals 11 ($V_{SW}$) in response to the comparison result signals 14 ($V_A$) of high level. The power switch circuit 110 increases the output voltage 12 ($V_{OUT}$), using the clock signal 11 ($V_{SW}$). The comparison circuit 120 operates intermittently in response to the frequency division signal (frequency-dividing ratio: 3) of the clock signal 11 ($V_{SW}$), which is generated as the operation control signal 25 ($V_{ON}$).

At time $t_1$, the feedback voltage ($V_{FB}$) becomes equal to the reference voltage 13 ($V_{REF}$). However, since the operation control signal 25 ($V_{ON}$) is at the low level at time $t_1$, the comparison circuit 120 does not perform the comparison operation, and the comparison signal 14 ($V_A$) of high level generated last continues to be output.

At time $t_2$, the operation control signal 25 ($V_{ON}$) becomes high in level, and the comparison circuit 120 resumes the comparison operation. The comparison circuit 120 detects that the feedback voltage ($V_{FB}$) is not lower than the reference voltage 13 ($V_{REF}$), and generates and outputs a comparison result signal 14 ($V_A$) of low level.

In response to the comparison result signal 14 ($V_A$) of low level, the operation control circuit 230 outputs an oscillation signal generated by the oscillation circuit 233, as an operation control signal 25 ($V_{ON}$). The oscillation circuit 100 stops its operation in response to the comparison result signal 14 ($V_A$) of low level. That is, as long as the comparison result signal 14 ($V_A$) is low in level, the comparison circuit 120 intermittently operates in response to the oscillation signal used as the operation control signal 25 ($V_{ON}$), and the oscillation circuit 100 is kept in the non-operating condition.

From time $t_3$ to time $t_4$, the load current ($I_{LOAD}$) flows through the load 150. As a result, the output voltage 12 ($V_{OUT}$) lowers, and in accordance therewith the feedback voltage ($V_{FB}$) also lowers.

From time $t_3$ to time $t_4$, the feedback voltage ($V_{FB}$) becomes lower than the reference voltage 13 ($V_{REF}$). However, since the operation control signal 25 ($V_{ON}$) is at the low level until time $t_5$, the comparison circuit 120 does not perform the comparison operation, and the comparison signal 14 ($V_A$) of low level generated last continues to be output.

At time $t_5$, the operation control signal 25 ($V_{ON}$) becomes high in level, and the comparison circuit 120 resumes the comparison operation. The comparison circuit 120 detects that the feedback voltage ($V_{FB}$) is lower than the reference voltage 13 ($V_{REF}$), and generates and outputs a comparison result signal 14 ($V_A$) of high level.

The oscillation circuit 100 resumes its operation in response to the comparison result signal 14 ($V_A$) of high level, and the power switch circuit 110 also resumes its operation. As a result, the feedback voltage ($V_{FB}$) starts increasing. The comparison circuit 120 operates intermittently in response to the frequency division signal (frequency-dividing ratio: 3) of the clock signal 11 ($V_{SW}$), which is generated as the operation control signal 25 ($V_{ON}$).

As described above, the switching power supply circuit of the second embodiment generates an operation control signal synchronous with the clock signal used for driving the power switch circuit when this power switch circuit is operating, and thereby permits the comparison circuit to operate intermittently. On the other hand, the switching power supply circuit generates an oscillation signal different from the clock signal when the power switch circuit is not operating, and thereby permits the comparison circuit to operate intermittently. In this manner, the switching power supply circuit causes the comparison circuit to operate intermittently, irrespective of the operating condition of the power switch circuit, and the power consumption can be reduced, accordingly.

Third Embodiment

As illustrated in FIG. 6, a switching power supply circuit according to the third embodiment comprises an oscillation circuit 300, a power switch circuit 110, a comparison circuit 120, an operation control circuit 330 and a switch 360.

The power switch circuit 110 depicted in FIG. 6 differs from the power switch circuit 110 depicted in FIG. 1 in that it receives a clock signal 31 from the switch 360. The comparison circuit 120 depicted in FIG. 6 differs from the comparison circuit 120 depicted in FIG. 1 in that it receives an operation control signal 35 from the operation control circuit 330 and supplies a comparison result signal 14 to the switch 360.

The oscillation circuit 300 includes an output terminal. The output terminal of the oscillation circuit 300 is connected to the input terminal of the operation control circuit 330 and the input terminal of the switch 360. The oscillation circuit 300 oscillates at a predetermined frequency, thereby generating a clock signal 31, and supplies the clock signal 31 to the operation control circuit 330 and the switch 360.

The operation control circuit 330 includes an input terminal and an output terminal. The input terminal of the operation control circuit 330 is connected to the output terminal of the oscillation circuit 300. The output terminal of the operation control circuit 330 is connected to the control terminal of the comparison circuit 120.

The operation control circuit 330 receives a clock signal 11 from the oscillation circuit 300. The operation control circuit 330 generates an operation control signal 35 synchronous with the clock signal 11, and supplies that operation control signal 35 to the comparison circuit 120. The comparison circuit 120 intermittently compares the feedback voltage with the reference voltage 13 in accordance with the operation control signal 35. The operation control circuit 330 may generate the operation control signal 35, for example, by dividing the frequency of the clock signal 11.

Unlike the oscillation circuit 100 described above, the oscillation circuit 300 used in the third embodiment generates a clock signal even when the comparison result signal 14 is at the second level. Therefore, the oscillation circuit 330 can generate an operation control signal 35 synchronous with a clock signal 11 even when the comparison result signal 14 is at the second level.

The switch 360 includes an input terminal, an output terminal and a control terminal. The input terminal of the switch 360 is connected to the output terminal of the oscillation circuit 300. The output terminal of the switch 360 is connected to the control terminal of the power switch circuit 110. The control terminal of the switch 360 is connected to the output terminal of the comparison circuit 120.

The switch 360 receives an operation control signal 35 supplied from the operation control circuit 330 and is turned ON/OFF in accordance with the operation control signal 35. In other words, the switch 360 short-circuits the output terminal of the oscillation circuit 300 and the control terminal of the power switch circuit 110 to each other or disconnects them from each other in accordance with the operation control signal 35.

To be specific, if the operation control signal 35 is at the first level, the switch 360 allows the clock signal 31 from the oscillation circuit 300 to be supplied to the power switch circuit 110. On the other hand, if the operation control signal 35 is at the second level, the switch 360 does not allow the clock signal 31 from the oscillation circuit 300 to be supplied.

FIG. 7 shows a specific example of the configuration of the switching power supply circuit of the third embodiment. The switching power supply circuit depicted in FIG. 7 comprises an oscillation circuit 300, a power switch circuit 110, a comparison circuit 120, an operation control circuit 330 and a switch 360. The switching power supply circuit depicted in FIG. 7 is connected to a load 150.

The power switch circuit 110 depicted in FIG. 7 differs from the power switch circuit 110 depicted in FIG. 2 in that the control terminal thereof is connected to the output terminal of the switch 360. The comparison circuit 120 depicted in FIG. 7 differs from the comparison circuit 120 depicted in FIG. 2 in that the output terminal thereof is connected to the control terminal of the switch 330 and the control terminal thereof is connected to the output terminal of the operation control circuit 330.

The oscillation circuit 300 depicted in FIG. 7 includes a constant on time control circuit 301.

The constant on time control circuit 301 includes an output terminal. The output terminal of the constant on time control circuit 301 is connected to the output terminal of the oscillation circuit 300. The constant on time control circuit 301 generates a clock signal 31 ($V_{SW}$) by oscillating at a predetermined frequency, and outputs the clock signal 31 ($V_{SW}$) from the output terminal. The clock signal 31 ($V_{SW}$) corresponds to a pulse signal having predetermined ON periods and OFF periods. The constant on time control circuit 301 repeatedly generates and outputs an ON pulse lasting for a predetermined time, as a clock signal 31 ($V_{SW}$).

The operation control circuit 330 depicted in FIG. 7 comprises a frequency division circuit 331.

The frequency division circuit 331 includes an input terminal and an output terminal. The input terminal of the frequency division circuit 331 is connected to the input terminal of the operation control circuit 330. The output terminal of the frequency division circuit 331 is connected to the output terminal of the operation control circuit 330.

The frequency division circuit 331 receives a clock signal 31 ($V_{SW}$) from the input terminal. The frequency division circuit 331 divides the frequency of a clock signal 31 ($V_{SW}$), thereby generating a frequency division signal. The frequency division circuit 331 outputs the frequency division signal as the operation control signal 35 ($V_{ON}$) from the output terminal. That is, the operation control signal 35 ($V_{ON}$) corresponds to the frequency division signal at all times. The greater the frequency-dividing ratio used by the frequency division circuit 331 is, the less frequently the comparison circuit 120 operates. The frequency-dividing ratio may be "1", in which case the frequency division circuit 331 need not be employed.

Figure 8:
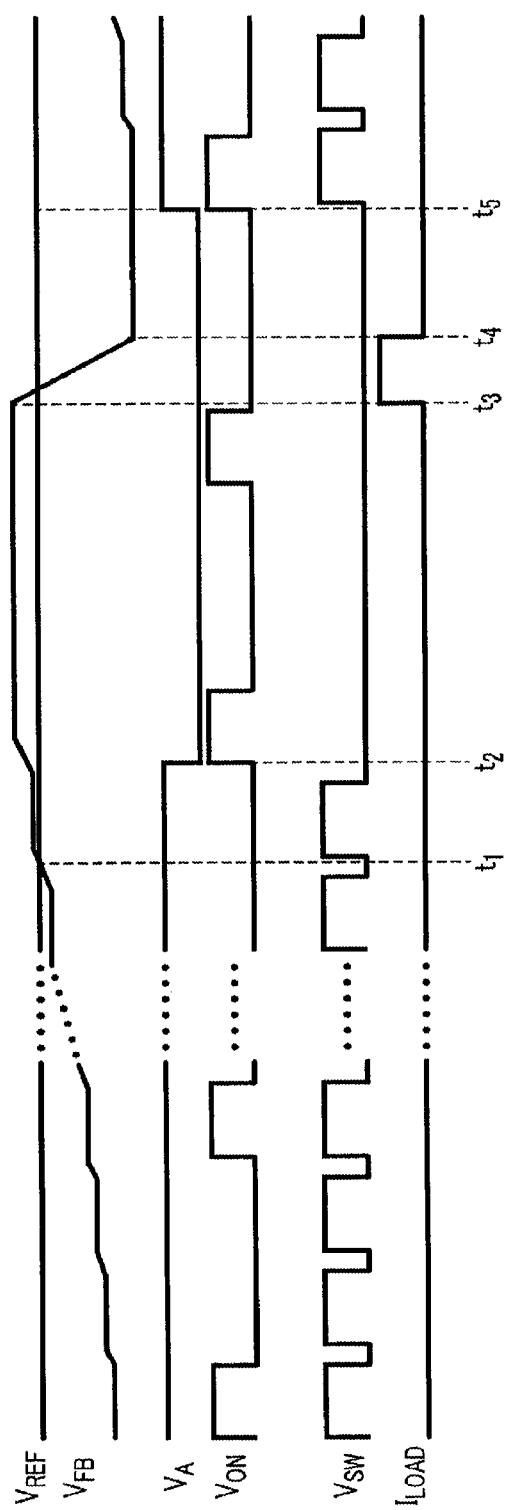
FIG. 8 is a timing chart illustrating the operation of the switching power supply circuit depicted in FIG. 7.

The switching power supply circuit depicted in FIG. 7 operates in such a manner as is illustrated in FIG. 8. In FIG. 8, $I_{LOAD}$ denotes a load current flowing through the load 150. $V_{SW}$ is an observation waveform appearing at the output terminal of the switch 360 (or at the control terminal of the power switch circuit 110). When the comparison result signal ($V_A$) is low in level, the clock signal 31 ($V_{SW}$) does not pass through the switch 360, and the waveform of $V_{SW}$ shown in FIG. 8 is steadily low in level.

In the example shown in FIG. 8, the feedback voltage ($V_{FB}$) is lower than the reference voltage 13 ($V_{REF}$) until time $t_1$. Therefore, the comparison circuit 120 keeps generating comparison result signals ($V_A$) of high level when it is in the operating condition. In other words, the comparison result signals ($V_A$) of high level are kept output, irrespective of the operating condition and the non-operating condition of the comparison circuit 120.

The switch 360 keeps supplying clock signals 31 ($V_{SW}$) to the power switch circuit 110 in response to the comparison result signals 14 ($V_A$) of high level. The power switch circuit 110 increases the output voltage 12 ($V_{OUT}$), using the clock signal 31 ($V_{SW}$). The comparison circuit 120 operates intermittently in response to the frequency division signal (frequency-dividing ratio: 3) of the clock signal 31 ($V_{SW}$), which is generated as the operation control signal 35 ($V_{ON}$).

At time $t_1$, the feedback voltage ($V_{FB}$) becomes equal to the reference voltage 13 ($V_{REF}$). However, since the operation control signal 35 ($V_{ON}$) is at the low level at time $t_1$, the comparison circuit 120 does not perform the comparison operation, and the comparison result signal 14 ($V_A$) of high level generated last continues to be output.

At time $t_2$, the operation control signal 35 ($V_{ON}$) becomes high in level, and the comparison circuit 120 resumes the comparison operation. The comparison circuit 120 detects that the feedback voltage ($V_{FB}$) is not lower than the reference voltage 13 ($V_{REF}$), and generates and outputs a comparison result signal 14 ($V_A$) of low level.

In response to the comparison result signal 14 ($V_A$) of low level, the switch 360 stops the supply of the clock signals 31 ($V_{SW}$). The comparison circuit 120 continues to operate intermittently in response to the frequency division signal of the clock signal 31 ($V_{SW}$), which is generated as the operation control signal 35 ($V_{ON}$). That is, as long as the comparison result signal 14 ($V_A$) is low in level, the power switch circuit 110 is kept in the non-operating condition, and the comparison circuit 120 continues to operate intermittently.

From time $t_3$ to time $t_4$, the load current ($I_{LOAD}$) flows through the load 150. As a result, the output voltage 12 ($V_{OUT}$) lowers, and in accordance therewith the feedback voltage ($V_{FB}$) also lowers.

From time $t_3$ to time $t_4$, the feedback voltage ($V_{FB}$) becomes lower than the reference voltage 13 ($V_{REF}$). However, since the operation control signal 35 ($V_{ON}$) is at the low level until time $t_5$, the comparison circuit 120 does not perform the comparison operation, and the comparison signal 14 ($V_A$) of low level generated last continues to be output.

At time $t_5$, the operation control signal 35 ($V_{ON}$) becomes high in level, and the comparison circuit 120 resumes the comparison operation. The comparison circuit 120 detects that the feedback voltage ($V_{FB}$) is lower than the reference voltage 13 ($V_{REF}$), and generates and outputs a comparison result signal 14 ($V_A$) of high level.

The switch 360 resumes the supply of clock signals 31 ($V_S$) in response to the comparison result signal 14 ($V_A$) of high level, and the power switch circuit 110 also resumes its operation. As a result, the feedback voltage ($V_{FB}$) starts increasing. On the other hand, the comparison circuit 120 continues to operate intermittently in response to the frequency division signal (frequency-dividing ratio: 3) of the clock signal 31 ($V_{SW}$), which is generated as the operation control signal 35 ($V_{ON}$).

As described above, the switching power supply circuit of the third embodiment generates an operation control signal synchronous with the clock signal used for driving the power switch circuit, irrespective of the operating state of the power switch circuit, and thereby permits the comparison circuit to operate intermittently. In this manner, the switching power supply circuit causes the comparison circuit to operate intermittently, irrespective of the operating condition of the power switch circuit, and the power consumption can be reduced, accordingly. Since the switching power supply circuit causes the comparison circuit to operate intermittently, using the driving signal source of the power switching circuit at all times, a new signal source need not be added.

Fourth Embodiment

As illustrated in FIG. 9, a switching power supply circuit according to the fourth embodiment comprises an oscillation circuit 400, a power switch circuit 110, a comparison circuit 120, an operation control circuit 330 and a switch 360.

The power switch circuit 110 depicted in FIG. 9 differs from the power switch circuit 110 depicted in FIG. 6 in that it receives a clock signal 41 from the switch 360. The comparison circuit 120 depicted in FIG. 9 differs from the comparison circuit 120 depicted in FIG. 6 in that it supplies a comparison result signal 14 to the oscillation circuit 400. The operation control circuit 330 depicted in FIG. 9 differs from the operation control circuit 330 depicted in FIG. 6 in that it receives a clock signal 41 from the oscillation circuit 400. The switch 360 depicted in FIG. 9 differs from the switch 360 depicted in FIG. 6 in that it receives a clock signal 41 from the oscillation circuit 400.

The oscillation circuit 400 includes a control terminal and an output terminal. The control terminal of the oscillation circuit 400 is connected to the output terminal of the comparison circuit 120. The output terminal of the oscillation circuit 400 is connected to both the input terminal of the operation control circuit 330 and the input terminal of the switch 360.

The oscillation circuit 400 receives a comparison result signal 14, described later, from the comparison circuit 120. The oscillation circuit 400 oscillates at a predetermined frequency, thereby generating a clock signal 41, and supplies the clock signal 41 to the operation control circuit 330 and the switch 360.

The oscillation circuit 400 switches properties of the clock signal 41, depending upon whether the comparison result signal 14 is at the first level or at the second level. To be specific, the clock signal 41 generated when the comparison result signal 14 is at the first level is different in property from the clock signal 41 generated when the comparison result signal 14 is at the second level. For example, the two kinds of clock signal 41 may have different frequencies or different duty ratios (i.e., a ratio of a high-level duration to one period).

For example, if the frequency or duty ratio of the clock signal 41 generated when the comparison result signal 14 is at the second level is set at a high value, the frequency or duty ratio of the operation control signal 35 is also a high value, and the non-operating periods of the comparison circuit 120 are short. Therefore, the comparison circuit 120 can promptly detect a state where the power switch circuit 110 should be resumed (e.g., a state where the feedback voltage is lower than the reference voltage 13). On the other hand, if the frequency or duty ratio of the clock signal 41 generated when the comparison result signal 14 is at the second level is set at a low value, the frequency or duty ratio of the operation control signal 35 is also a low value, and the non-operating periods of the comparison circuit 120 are long. Thus, the power consumption by the comparison circuit 120 can be significantly reduced.

As described above, the switching power supply circuit of the fourth embodiment generates an operation control signal synchronous with the clock signal used for driving the power switch circuit, irrespective of the operating state of the power switch circuit, and thereby permits the comparison circuit to operate intermittently. In this manner, the switching power supply circuit causes the comparison circuit to operate intermittently, irrespective of the operating condition of the power switch circuit, and the power consumption can be reduced, accordingly. Since the switching power supply circuit causes the comparison circuit to operate intermittently, using the driving signal source of the power switching circuit, a new signal source need not be added. In addition, since the switching power supply circuit switches properties of the clock signal between the operating state of the power switch circuit and the non-operating state of the power switch circuit, the properties of the operation control signal are also switched between the two states. That is, the switching power supply circuit can be designed in such a manner that the comparison circuit can operate with a high degree of freedom in the non-operating state of the power switch circuit.

Fifth Embodiment

As illustrated in FIG. 10, a switching power supply circuit according to the fifth embodiment comprises an oscillation circuit 500, a power switch circuit 110, an operation circuit 520, an operation control circuit 530 and a pulse width modulation (PWM) control circuit 570. The power switch circuit 110 depicted in FIG. 10 differs from the power switch circuit 110 depicted in FIG. 1 in that it receives a switching control signal (corresponding to the clock signal 11 described above), from the PWM control circuit 570 and supplies an output voltage 12 to the operation circuit 520.

The oscillation circuit 500 includes an output terminal. The output terminal of the oscillation circuit 500 is connected to the input terminal of the operation control circuit 530 and the input terminal of the PWM control circuit 570. The oscillation circuit 500 oscillates at a predetermined frequency, thereby generating a triangle wave signal 51, and supplies the triangle wave signal 51 to the operation control circuit 530 and the PWM control signal 570. The triangle wave signal 51 may have a sawtooth waveform or any other triangular waveform.

The operation circuit 520 includes a first input terminal, a second input terminal, a control terminal and an output terminal. The first input terminal of the operation circuit 520 is connected to the output terminal of the power switch circuit 110 and is applied with the output voltage 12. The second input terminal of the operation circuit 520 is applied with the reference voltage 13. The control terminal of the operation circuit 520 is connected to the output terminal of the operation control circuit 530. The output terminal of the operation circuit 520 is connected to the control terminal of the PWM control circuit 570.

The operation circuit 520 receives an operation control signal 55 from the operation control circuit 530. The operation circuit 520 operates intermittently in accordance with the operation control signal 55. If the operation control signal 55 at a first level, the operation circuit 520 performs an operation using (i) a feedback voltage based on the output voltage 12 and (ii) the reference voltage 13, and generates an operation result signal 54 representing the result of operation. The operation circuit 520 performs negative feedback control for the power switch circuit 110 by way of the PWM control circuit 570, in such a manner that the feedback voltage becomes equal to the reference voltage 13. For example, if the feedback voltage is a/b times as high as the output voltage 12, the negative feedback control is performed so that the output voltage 12 becomes equal to b/a of the reference voltage 13.

For example, the operation circuit 520 calculates a differential voltage between the feedback voltage and the reference voltage 13 and generates an operation result signal 54 having a voltage obtained by inverting and amplifying the differential voltage. The operation circuit 520 may perform a phase compensation operation, a proportional-integrated-derivative (PID) operation, or the like. The operation circuit 520 supplies the operation result signal 54 to the PWM control circuit 570.

If the operation control signal 55 is at the second level, the operation circuit 520 stops its operation (an operation using the feedback voltage and the reference voltage 13), and continues to output the operation result signal 54 generated last (i.e., the operation result signal generated immediately before the operation control signal 55 transitions from the first level to the second level).

The operation control circuit 530 includes an input terminal and an output terminal. The input terminal of the operation control circuit 530 is connected to the output terminal of the oscillation circuit 500. The output terminal of the operation control circuit 530 is connected to the control terminal of the operation circuit 520.

The operation control circuit 530 receives a triangle wave signal 51 from the oscillation circuit 500. The operation control circuit 530 generates an operation control signal 55 synchronous with the triangle wave signal 51, and supplies that operation control signal 55 to the operation circuit 520. As described above, the operation circuit 520 intermittently performs the operation using the feedback voltage and the reference voltage 13, in accordance with the operation control signal 55. The operation control circuit 530 may generate the operation control signal 55, for example, by dividing the frequency of the triangle wave signal 51.

The PWM control circuit 570 includes an input terminal, an output terminal and a control terminal. The input terminal of the PWM control circuit 570 is connected to the output terminal of the oscillation circuit 500. The output terminal of the PWM control circuit 570 is connected to the control terminal of the power switch circuit 110. The control terminal of the PWM control circuit 570 is connected to the output terminal of the operation circuit 520.

The PWM control circuit 570 receives a triangle wave signal 51 from the oscillation circuit 500 and an operation result signal 54 from the operation circuit 520. The PWM control circuit 570 uses the voltage of the operation result signal 54 as an analog control voltage and performs pulse width modulation for the triangle wave signal 51, thereby generating a switching control signal. The PWM control circuit 570 may perform various pulse width modulations. For example, the PWM control circuit 570 may repeatedly generate an ON pulse as a switching control signal, when the voltage of the triangle wave signal 51 is lower than the analog control voltage. The PWM control circuit 570 supplies the switching control signal to the power switch circuit 110.

FIG. 11 shows a specific example of the configuration of the switching power supply circuit of the fifth embodiment. The switching power supply circuit depicted in FIG. 11 comprises an oscillation circuit 500, a power switch circuit 110, an operation circuit 520, an operation control circuit 530 and a PWM control circuit 570. The switching power supply circuit depicted in FIG. 11 is connected to a load 150. The power switch circuit 110 depicted in FIG. 11 differs from the power switch circuit 110 depicted in FIG. 2 in that the control terminal thereof is connected to the output terminal of the PWM control circuit 570.

The oscillation circuit 500 depicted in FIG. 11 includes a triangle wave generation circuit 501.

The triangle wave generation circuit 501 includes an output terminal. The output terminal of the triangle wave generation circuit 501 is connected to the output terminal of the oscillation circuit 500. The triangle wave generation circuit 501 generates a triangle wave signal 51 ($V_{SAW}$) by oscillating at a predetermined frequency, and outputs the triangle wave signal 51 ($V_{SAW}$) from the output terminal.

Figure 12:
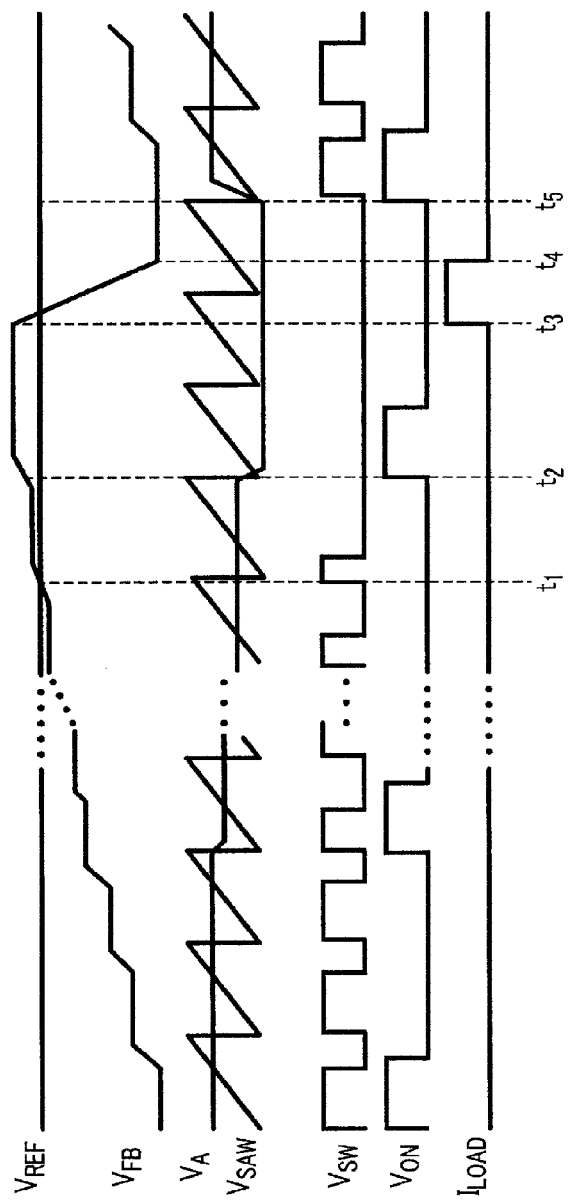
FIG. 12 is a timing chart illustrating the operation of the switching power supply circuit depicted in FIG. 11.

The triangle wave signal 51 ($V_{SAW}$) has, for example, a sawtooth waveform, as shown in FIG. 12.

The operation circuit 520 depicted in FIG. 11 includes switch 521, resisters 522 and 523, an amplifier 524, switch 525 and a hold circuit 526.

Switch 521 includes a first terminal, a second terminal and a control terminal. The first terminal of switch 521 is connected to the first input terminal of the operation circuit 520. The second terminal of switch 521 is connected to the first terminal of resistor 522. The control terminal of switch 521 is connected to the control terminal of the operation circuit 520.

Switch 521 receives an operation control signal 55 ($V_{ON}$) at the control terminal and performs ON/OFF operation in response to the operation control signal 55 ($V_{ON}$). In other words, switch 521 short-circuits the first input terminal of the operation circuit 520 and the first terminal of resistor 522 to each other or disconnects them from each other in accordance with the operation control signal 55 ($V_{ON}$).

To be specific, if the operation control signal 55 ($V_{ON}$) is at the first level, switch 521 allows the output voltage 12 ($V_{OUT}$) to be applied to resistor 522. On the other hand, if the operation control signal 55 ($V_{ON}$) is at the second level, switch 521 does not allow application of the output voltage 12 ($V_{OUT}$).

As can be seen, resistor 522 and resistor 523 function as a voltage divider. Resistor 522 includes a first terminal and a second terminal. The first terminal of resistor 522 is connected to the second terminal of switch 521. The second terminal of resistor 522 is connected to both the first terminal of resistor 523 and the first input terminal of the amplifier 524. Resistor 523 includes a first terminal and a second terminal. The first terminal of resistor 523 is connected to both the second terminal of resistor 522 and the first input terminal of the amplifier 524. The second terminal of resistor 523 is grounded.

When the switch 521 in ON, the first terminal of resistor 522 is applied with an output voltage 12 ($V_{OUT}$) through switch 521. The output voltage 12 ($V_{OUT}$) is divided in accordance with the resistance ratio of resistors 522 and 523. Eventually, the voltage appearing at the second terminal of resistor 522 and at the first terminal of resistor 523 is applied to the first input terminal of the amplifier 524 as a feedback voltage ($V_{FB}$). For example, if the resistance of resistor 522 is $R_1$ and the resistance of resistor 523 is $R_2$, the following formula is satisfied:

$$V_{FB}=R_2*V_{OUT}(R_1+R_2).$$

The amplifier 524 includes a first input terminal, a second input terminal, an output terminal and a control terminal. The first input terminal of the amplifier 524 is connected to both the second terminal of resistor 522 and the first terminal of resistor 523. The second input terminal of the amplifier 524 is applied with a reference voltage 13 ($V_{REF}$). The output terminal of the amplifier 524 is connected to the first terminal of switch 525. The control terminal of amplifier 524 is connected to the control terminal of the operation circuit 520.

The amplifier 524 performs an operation using the feedback voltage ($V_{FB}$) applied to the first input terminal and the reference voltage 13 ($V_{REF}$) applied to the second input terminal. For example, the amplifier 524 calculates a differential voltage ($V_{FB}-V_{REF}$) between the feedback voltage ($V_{FB}$) and the reference voltage 13 ($V_{REF}$) and generates an operation result signal 54 having a voltage obtained by inverting and amplifying the differential voltage. The amplifier 524 outputs an operation result signal 54 from the output terminal.

The amplifier 524 receives an operation control signal 55 ($V_{ON}$) from the control terminal. If the operation control signal 55 ($V_{ON}$) is at the first level, the amplifier 524 performs the operation described above (namely, the operation using the feedback voltage ($V_{FB}$) and the reference voltage 13 ($V_{REF}$)). On the other hand, if the operation control signal 55 ($V_{ON}$) is at the second level, the amplifier 524 stops the above operation. That is, the amplifier 524 operates intermittently in accordance with the operation control signal 55 ($V_{ON}$).

Switch 525 includes a first terminal, a second terminal and a control terminal. The first terminal of switch 525 is connected to the output terminal of the amplifier 524. The second terminal of switch 525 is connected to the input terminal of the hold circuit 526. The control terminal of switch 525 is connected to the control terminal of the operation circuit 520.

Switch 525 receives an operation control signal 55 ($V_{ON}$) at the control terminal and performs ON/OFF operation in response to the operation control signal 55 ($V_{ON}$). In other words, switch 525 short-circuits the output terminal of the amplifier 524 and the input terminal of the hold circuit 526 to each other or disconnects them from each other in accordance with the operation control signal 55 ($V_{ON}$).

To be specific, if the operation control signal 55 ($V_{ON}$) is at the first level, switch 525 allows the operation result signal 54 ($V_A$) from the amplifier 524 to be supplied to the hold circuit 526. On the other hand, if the operation control signal 55 ($V_{ON}$) is at the second level, switch 525 does not allow the operation result signal 54 ($V_A$) from the amplifier 524 to be supplied.

The hold circuit 526 holds an input signal and outputs the held signal. The hold circuit 526 includes an input terminal and an output terminal. The input terminal of the hold circuit 526 is connected to the second terminal of switch 525. The output terminal of the hold circuit 526 is connected to the output terminal of the operation circuit 520. The hold circuit 526 is, for example, a sample/hold circuit.

The hold circuit 526 receives an operation result signal 54 ($V_A$) from the input terminal during an ON period of switch 525, and holds it. The hold circuit 526 outputs the held operation result signal 54 ($V_A$) from the output terminal. The amplifier 524 does not generate an operation result signal 54 ($V_A$) during an OFF period of switch 525, but the hold circuit 526 holds the operation result signal 54 ($V_A$) supplied thereto immediately before the switch 525 is turned OFF (namely, immediately before the operation control signal 55 ($V_A$) transitions from the first level to the second level). For this reason, the hold circuit 526 can output the operation result signal 54 ($V_A$) even during the OFF period of switch 525.

The operation control circuit 530 depicted in FIG. 7 comprises a frequency division circuit 531

The frequency division circuit 531 includes an input terminal and an output terminal. The input terminal of the frequency division circuit 531 is connected to the input terminal of the operation control circuit 130. The output terminal of the frequency division circuit 531 is connected to the output terminal of the operation control circuit 530.

The frequency division circuit 531 receives a triangle wave signal 51 ($V_{SAW}$) from the input terminal. The frequency division circuit 531 divides the frequency of the triangle wave signal 51 ($V_{SAW}$), thereby generating a frequency division signal. The frequency division circuit 531 outputs a frequency division signal as the operation control signal 35 ($V_{ON}$) from the output terminal. That is, the operation control signal 55 ($V_{ON}$) corresponds to the frequency division signal at all times. The greater the frequency-dividing ratio used by the frequency division circuit 531 is, the less frequently the operation circuit 520 operates. The frequency-dividing ratio may be "1", in which case the frequency division circuit 531 need not be employed.

The switching power supply circuit depicted in FIG. 11 operates in such a manner as is illustrated in FIG. 12. In FIG. 12, $I_{LOAD}$ denotes a load current flowing through the load 150. $V_{SW}$ is a waveform of the switching control signal.

In the example shown in FIG. 12, the feedback voltage ($V_{FB}$) is lower than the reference voltage 13 ($V_{REF}$) until time $t_1$. In the operating condition, the operation circuit 520 performs an operation using the feedback voltage ($V_{FB}$) and the reference voltage 13 ($V_{REF}$). The operation circuit 520 continues to generate an operation result signal 54 ($V_A$) whose voltage increases in inverse portion to a decrease in the differential voltage ($V_{FB}$-$V_{REF}$) of the feedback voltage ($V_{FB}$) to the reference voltage 13 ($V_{REF}$).

The voltage of the operation result signal 54 ($V_A$) which the operation circuit 520 generates when the feedback voltage ($V_{FB}$) is lower than the reference voltage 13 ($V_{REF}$) is set at a value higher than the lower-limit voltage of the triangle wave signal 51 ($V_{SAW}$). For this reason, the PWM control circuit 570 continues to generate a switching control signal ($V_{SW}$) including an ON pulse, in accordance with the operation result signal 54 ($V_A$). The power switch circuit 110 increases the output voltage 12 ($V_{OUT}$), using the switching control signal ($V_{SW}$). The operation circuit 520 operates intermittently in response to the frequency division signal (frequency-dividing ratio: 3) of the triangle wave signal 11 ($V_{SAW}$), which is generated as the operation control signal 55 ($V_{ON}$).

At time $t_1$, the feedback voltage ($V_{FB}$) becomes equal to the reference voltage 13 ($V_{REF}$). However, since the operation control signal 55 ($V_{ON}$) is at the low level at time $t_1$, the operation circuit 520 does not perform the operation, and the operation result signal 54 ($V_A$) generated last continues to be output.

At time $t_2$, the operation control signal 55 ($V_{ON}$) becomes high in level, and the operation circuit 520 resumes the operation. The operation circuit 520 performs an operation using the feedback voltage ($V_{FB}$) and the reference voltage 13 ($V_{REF}$). The operation circuit 520 generates and outputs an operation result signal 54 ($V_A$) whose voltage increases in inverse portion to a decrease in the differential voltage ($V_{FB}$-$V_{REF}$) of the feedback voltage ($V_{FB}$) to the reference voltage 13 ($V_{REF}$).

The voltage of the operation result signal 54 ($V_A$) which the operation circuit 520 generates when the feedback voltage ($V_{FB}$) is not lower than the reference voltage 13 ($V_{REF}$) is set at a value lower than the lower-limit voltage of the triangle wave signal 51 ($V_{SAW}$). For this reason, the PWM control circuit 570 continues to generate a switching control signal ($V_{SW}$) not including an ON pulse, in accordance with the operation result signal 54 ($V_A$). In this condition, the power switch circuit 110 stops its operation. The operation circuit 520 continues to operate intermittently in response to the frequency division signal of the triangle wave signal 51 ($V_{SAW}$), which is generated as the operation control signal 55 ($V_{ON}$). That is, as long as the voltage of the operation result signal 54 ($V_A$) is equal to or lower than the lower-limit voltage of the triangle wave signal 51 ($V_{SAW}$), the power switch circuit 110 is kept in the non-operating condition, and the operation circuit 520 continues to operate intermittently.

From time $t_3$ to time $t_4$, the load current ($I_{LOAD}$) flows through the load 150. As a result, the output voltage 12 ($V_{OUT}$) lowers, and in accordance therewith the feedback voltage ($V_{FB}$) also lowers.

From time $t_3$ to time $t_4$, the feedback voltage ($V_{FB}$) becomes lower than the reference voltage 13 ($V_{REF}$). However, since the operation control signal 55 ($V_{ON}$) is at the low level until time $t_5$, the operation circuit 520 does not perform the operation, and the operation result signal 54 ($V_A$) generated last continues to be output.

At time $t_5$, the operation control signal 55 ($V_{ON}$) becomes high in level, and the operation circuit 520 resumes the operation. The operation circuit 520 performs an operation using the feedback voltage ($V_{FB}$) and the reference voltage 13 ($V_{REF}$). The operation circuit 520 generates and outputs an operation result signal 54 ($V_A$) whose voltage increases in inverse portion to a decrease in the differential voltage ($V_{FB}$-$V_{REF}$) of the feedback voltage ($V_{FB}$) to the reference voltage 13 ($V_{REF}$).

Then, the PWM control circuit 570 generates a switching control signal ($V_{SW}$) including an ON pulse again, in accordance with the operation result signal 54 ($V_A$), and the power switch circuit 110 also resumes its operation. As a result, the feedback voltage ($V_{FB}$) starts increasing. The operation circuit 520 operates intermittently in response to the frequency division signal (frequency-dividing ratio: 3) of the triangle wave signal 11 ($V_{SAW}$), which is generated as the operation control signal 55 ($V_{ON}$).

As described above, the switching power supply circuit of the fifth embodiment generates an operation control signal synchronous with the triangle wave signal used for indirectly driving the power switch circuit, irrespective of the operating state of the power switch circuit, and thereby permits the operation circuit to operate intermittently. In this manner, the switching power supply circuit causes the operation circuit to operate intermittently, irrespective of the operating condition of the power switch circuit, and the power consumption can be reduced, accordingly. Since the switching power supply circuit causes the operation circuit to operate intermittently, using the indirect driving signal source of the power switching circuit, a new signal source need not be added.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A switching power supply circuit comprising:
   a power switch circuit that generates an output voltage different in level from an input voltage, using a clock signal;
   a comparison circuit that operates intermittently in response to an operation control signal, the comparison circuit comparing a feedback voltage based on the output voltage with a reference voltage to generate a comparison result signal representing a result of comparison;

an oscillation circuit that oscillates at a predetermined frequency to generate the clock signal, if the comparison result signal is at a first level; and an operation control circuit that generates the operation control signal based on the clock signal and the comparison result signal, wherein the operation control circuit generates an operation control signal synchronous with the clock signal, if the comparison result signal is at the first level.

2. The circuit according to claim 1, wherein the operation control circuit includes a frequency division circuit that divides a frequency of the clock signal to generate a frequency division signal, and the operation control circuit outputs the frequency division signal as the operation control signal if the comparison result signal is at the first level.

3. The circuit according to claim 1, wherein the operation control circuit generates an operation control signal for steadily operating the comparison circuit, if the comparison result signal is at a second level.

4. The circuit according to claim 3, wherein the operation control circuit includes an internal oscillation circuit that oscillates at a predetermined frequency to generate an oscillation signal, if the comparison result signal is at the second level, and the operation control circuit outputs the oscillation signal as the operation control signal if the comparison result signal is at the second level.

5. A switching power supply circuit comprising:
an oscillation circuit that oscillates at a predetermined frequency to generate a clock signal;
an operation control circuit that generates an operation control signal synchronous with the clock signal;
a power switch circuit that generates an output voltage different in level from an input voltage, using the clock signal;
a comparison circuit that operates intermittently in response to the operation control signal, the comparison circuit comparing a feedback voltage based on the output voltage with a reference voltage to generate a comparison result signal representing a result of comparison; and a switch that permits the clock signal from the oscillation circuit to be supplied to the power switch circuit if the comparison result signal is at a first level, and that stops supply of the clock signal from the oscillation circuit if the comparison result signal is at a second level.

6. The circuit according to claim 5, wherein the operation control circuit divides a frequency of the clock signal to generate the operation control signal.

7. The circuit according to claim 5, wherein the oscillation circuit switches properties of the clock signal, depending upon whether the comparison result signal is at the first level or at the second level.

8. A switching power supply circuit comprising:
a power switch circuit that generates an output voltage different in level from an input voltage, using a switching control signal;
an oscillation circuit that oscillates at a predetermined frequency to generate a triangle wave signal;
an operation control circuit that generates an operation control signal synchronous with the triangle wave signal;
an operation circuit that operates intermittently in response to the operation control signal, the operation circuit performing an operation using (i) a feedback voltage based on the output voltage and (ii) a reference voltage to generate an operation result signal representing a result of operation; and
a pulse width modulation (PWM) control circuit that uses the operation result signal as an analog control voltage and performs pulse width modulation for the triangle wave signal to generate the switching control signal.

9. The circuit according to claim 8, wherein the operation control circuit divides a frequency of the triangle wave signal to generate the operation control signal.

* * * * *

UNITED STATES PATENT AND TRADEMARK OFFICE
CERTIFICATE OF CORRECTION

Page 1 of 1

PATENT NO. : 9,559,582 B2
APPLICATION NO. : 14/926239
DATED : January 31, 2017
INVENTOR(S) : Taichi Ogawa et al.

It is certified that error appears in the above-identified patent and that said Letters Patent is hereby corrected as shown below:

On the Title Page

Item (30), the Foreign Application Priority Data Information has been omitted. Item (30) should read:

-- (30)  Foreign Application Priority Data
Dec. 12, 2014   (JP)..............................2014-252032 --

Signed and Sealed this
Second Day of January, 2018

Joseph Matal
*Performing the Functions and Duties of the*
*Under Secretary of Commerce for Intellectual Property and*
*Director of the United States Patent and Trademark Office*